United States Patent [19]
Luich

[11] Patent Number: 4,734,885
[45] Date of Patent: Mar. 29, 1988

[54] PROGRAMMING ARRANGEMENT FOR PROGRAMMABLE DEVICES

[75] Inventor: Thomas M. Luich, Puyallup, Wash.

[73] Assignee: Harris Corporation, Melbourne, Fla.

[21] Appl. No.: 788,585

[22] Filed: Oct. 17, 1985

[51] Int. Cl.$^4$ .............................................. G11C 17/06
[52] U.S. Cl. ...................................... 365/94; 365/96; 365/103; 307/465
[58] Field of Search ................... 365/94, 96, 103, 104, 365/105, 189; 307/465

[56] References Cited

U.S. PATENT DOCUMENTS

| | | |
|---|---|---|
| 4,122,547 | 10/1978 | Schroeder et al. |
| 4,125,880 | 11/1978 | Taylor. |
| 4,152,627 | 5/1979 | Priel et al. .......................... 365/96 X |
| 4,276,617 | 6/1981 | Le. |
| 4,319,341 | 3/1982 | Fukushima et al. |
| 4,347,584 | 8/1982 | Fukushima et al. ................. 365/104 |
| 4,385,368 | 5/1983 | Principi et al. ...................... 365/105 |
| 4,412,308 | 10/1983 | Bergeron ........................... 365/96 X |
| 4,417,154 | 11/1983 | Kuo ................................... 365/96 X |
| 4,446,534 | 5/1984 | Smith ................................. 365/104 X |

FOREIGN PATENT DOCUMENTS 0098215  1/1984  European Pat. Off. .............. 365/96

*Primary Examiner*—James W. Moffitt
*Assistant Examiner*—Alyssa H. Bowler
*Attorney, Agent, or Firm*—Barnes & Thornburg

[57] ABSTRACT

A programmable matrix has improved programming circuitry which allows the matrix to be programmed without raising the output terminals or power supply to higher than normal voltage levels. The circuitry includes a bidirectional output buffer and a multi-purpose input pin. The output buffer is provided with a control input and at least one buffer output. A switching device in the buffer provides a path to ground for programming current when a programming enable signal is applied to the control input and a concurrent operating level voltage pulse is applied to a selected buffer output. Programming current may be supplied via a dedicated input pin, but is preferably supplied via the multi-purpose input pin. A higher than normal operating voltage signal applied to the multi-purpose input pin acts to produce the programming enable signal which is subsequently applied to the buffer control input. This arrangement makes it unnecessary to elevate the voltage on the power supply input or the buffer outputs for programming purposes. The buffer outputs are isolated from programming currents and voltages by a second switching device in the bidirectional output buffer. The programming arrangement may be used with PROMs, PLAs and other programmable matrices.

18 Claims, 6 Drawing Figures

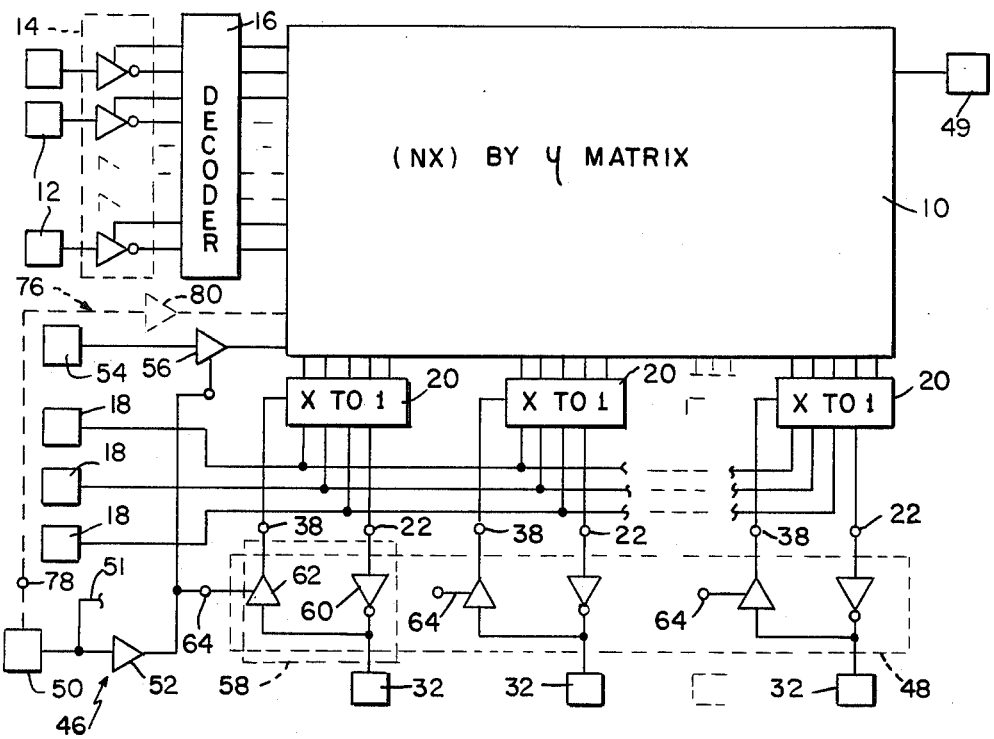
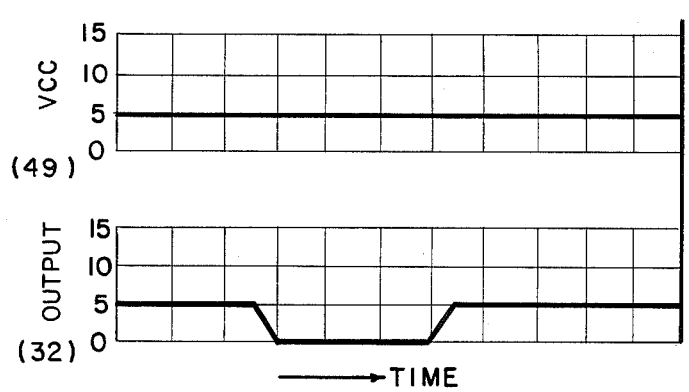
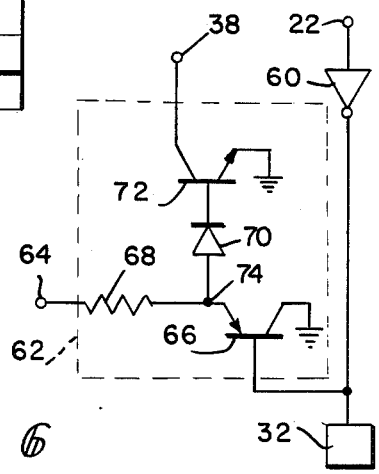
FIG. 4
FIG. 5
FIG. 6

PROGRAMMING ARRANGEMENT FOR PROGRAMMABLE DEVICES

BACKGROUND AND SUMMARY OF THE INVENTION

The present invention relates generally to a programming arrangement for matrices and, more particularly, to an arrangement for programming a matrix which does not require application of higher than normal logic level signals to either the matrix power supply input or the matrix output terminals.

Programmable memory devices are currently programmed by a number of techniques which usually require raising the power supply input, and/or one of several output pins to a level voltage which is substantially higher than normal operational voltage levels. Raising the power supply input voltage dramatically increases current consumption of the device during operation in the programming or editing mode. Raising the voltage level at the output terminals above the normal operational voltage level requires that adequate breakdown protection be provided in the output circuitry. Such protection has an adverse impact upon the AC performance (i.e., the operating speed) of the memory device.

U.S. Pat. No. 4,125,880 to Taylor is a Harris Corporation patent which illustrates a known programming technique of this type. In Taylor, a ten volt signal is applied to output pin 60, causing a zener diode 74 to conduct and transistor 72 to turn on. The power supply terminal $V_{CC}$, which is connected to the collectors of the transistors in the matrix, is raised from the normal operating level of 5 volts to a programming level of 12 volts. When a selected memory location is addressed, diode 78 and transistor 72 provide a low impedance current sink for the flow of programming current resulting from the high collector voltage present at the selected memory location. A voltage is applied to chip enable terminal 20 to turn off transistor 52 to prevent programming currents or voltages from damaging output transistor 58.

U.S. Pat. No. 4,276,617 to Le shows another technique for protecting the output network from programming currents. This patent describes a programming logic circuit which is activated by a signal EN to produce low voltages A and B and high voltage C. High voltage C activates transistors 103 and 105 to provide a direct connection between the select logic 40 and the output pin 0, bypassing the sense amplifier. Voltages A and B disable the remainder of the sense amplifiers. Thus, the output circuitry is protected from the programming current which is applied to output terminal 0.

As noted, programming techniques such as those described above consume relatively large amounts of power, dissipate correspondingly large amounts of power in the device, and/or require additional circuitry for protecting output circuits from the high programming voltages and currents. Thus, there exists a need for a new technique of programming a matrix which provides for low power consumption and dissipation during programming and editing functions, and which provides a low AC performance impact.

Accordingly, an object of the present invention is to provide a programming arrangement for a programmable matrix which eliminates the need for breakdown voltage protection on the output pins, thus improving AC performance and eliminating potential AC design limitations.

Another object of the present invention is to provide a programming arrangement which significantly lowers power consumption and dissipation during programming and editing modes.

Still another object of the present invention is to provide a programmable array which does not require a change in the power supply voltage, thus allowing for the use of "in system" programming procedures.

These and other objects of the invention are attained in a programmable matrix having bit addressing inputs, bit outputs, a power supply input, a programming current input, and programming control circuitry which comprises a multi-purpose input pin, a circuit for providing programming current to the programming current input, a bidirectional output buffer, and circuitry for producing a programming enable signal when a higher than normal operating level voltage signal is applied to the multi-purpose input pin. The bidirectional buffer is connected to the bit outputs of the matrix and has at least one buffer output and a control input for receiving the programming enable signal. The buffer provides a path for programming current to flow from a selected bit location in the matrix when a normal operating level pulse is provided at the buffer output while the programming enable signal is present at the control input. The control input of the buffer is isolated from the buffer output terminal by a first switching device. This switching device is responsive to a normal operating level voltage signal, applied to the buffer output, to cause a second switching device in the buffer to provide a path to ground for programming current from a selected bit location. The programming current circuitry may also be provided with a buffer which is responsive to the programming enable signal to control the flow of programming current.

In a preferred embodiment, the multi-purpose input pin is connected to three separate circuits, each responsive to a different voltage level signal. The multi-purpose pin is connected to an operating circuit, such as a chip enable circuit, which is responsive to a normal operating level voltage signal applied to the pin. The pin is also connected to the programming circuitry which produces the programming enable signal in response to a higher than normal voltage level signal applied to the pin. The pin is further connected to the programming current supply and to the programming current input for supplying programming current to the matrix when a programming level voltage (which may be higher than the higher than normal voltage signal) is applied to the pin.

A preferred method of programming the matrix includes the steps of: applying addressing level voltage signals to the bit addressing inputs to select a bit to be programmed; applying a programming level voltage signal to the programming current input; applying a programming enable signal to the control input of the bidirectional buffer; and selectively applying a normal logic level voltage signal to the buffer output to cause the bi-directional buffer to provide a path for programming current to flow from the selected bit.

By connecting the programming current supply to an input pin, the potential for breakdown which exists when the power supply pin or an output pin is raised to a high voltage for programming is essentially eliminated. The proposed technique converts the output pins of the buffer into bidirectional pins that will accept TTL level inputs to initiate programming. These bidirectional pins function as output pins until the output buffer is enabled by a first higher voltage supplied to the multi-purpose input pin. With the first higher voltage present at this input pin, and a second higher voltage applied to this, or another, input pin to supply programming current, the bidirectional pins can be used to trigger the programming event via application of a normal operating level voltage signal.

Other objects, advantages and novel features of the present invention will become apparent from the following detailed description of the invention when considered in conjunction with the accompanying drawings.

BRIEF DESCRIPTION OF THE DRAWINGS

FIG. 4 shows a PROM architecture having programming circuitry according to the present invention.

FIG. 5 shows a voltage/time diagram for the power supply and output terminals during a single programming cycle for the PROM architecture shown in FIG. 4.

FIG. 6 shows, in detail, a representative segment of the output buffer of the PROM of FIG. 4.

DETAILED DESCRIPTION OF THE DRAWINGS

Figure 1:
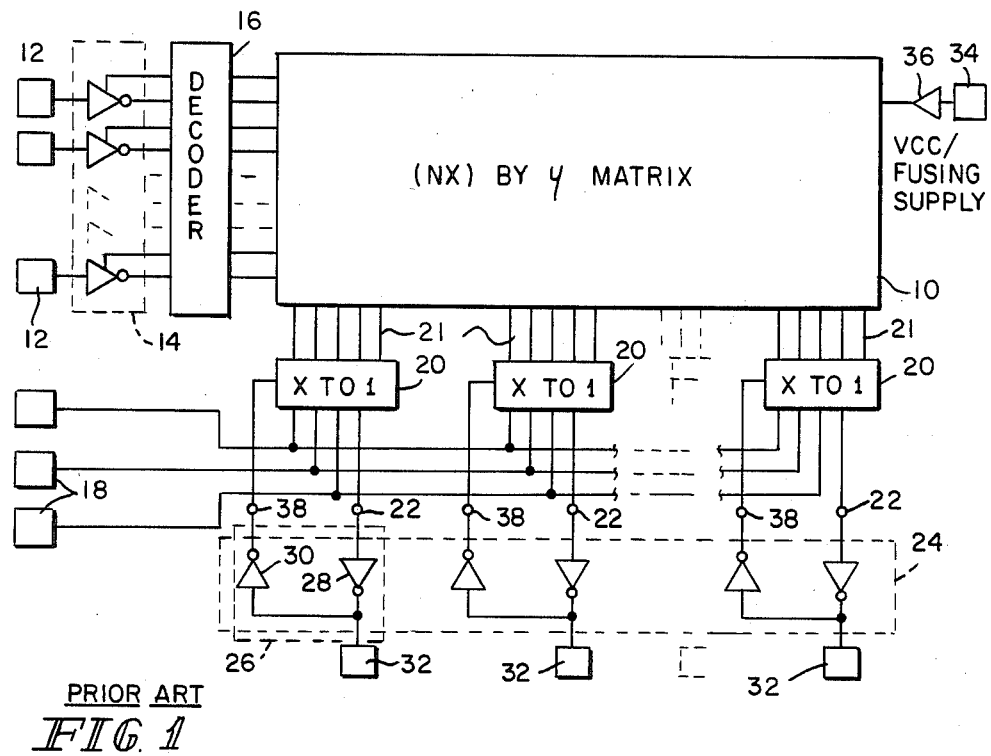
FIG. 1 shows a typical PROM architecture for use with prior art programming techniques.

FIG. 1 shows a programmable read only memory architecture for use with prior art programming techniques. The PROM of FIG. 1 includes a programmable matrix 10 having Y rows and NX columns. The Y rows are addressed by means of input circuitry which includes row input terminals 12, input buffer 14, and decoder 16. The columns of matrix 10 are addressec by circuitry which includes column input terminals 18 connected in parallel to N (X to 1) decoders 20. Each decoder is connected to the bit outputs (21) of the matrix. The decoder outputs (22) are connected as inputs to output buffer 24. A representative segment of output buffer 24, as indicated by a broken line and reference numeral 26, includes output inverter 28 and input inverter 30. The input of inverter 28 is connected to decoder output 22 and the output of inverter 28 is connected to output terminal 32. The input of inverter 30 is also connected to output terminal 32 and the output inverter 30 is connected to decoder 20. The PROM circuit of FIG. 1 also includes power supply terminal 34 and power supply input buffer 36 for application to the matrix of an operating voltage $V_{CC}$, and a higher programming voltage, as will be explained in more detail below.

During READ operations, a "normal logic level voltage" appears at outputs 22 in response to address inputs applied to terminals 12 and 18. These voltages are applied to the input of inverter 28 and, subsequently, to output terminals 32. The term "normal logic level voltages," as used throughout this application, means logic level voltages that do not exceed the normal operating voltage level ($V_{CC}$) of the memory device. In the examples discussed below, the operating voltage $V_{CC}$ is 5.0 volts. Thus, the normal high logic level voltage is equal to, or less than, 5.0 volts, while the normal low logic level voltage is approximately zero volts.

Inverter 30 is not responsive to "normal logic level voltages" present at output terminal 32. Inverters 30 are, instead, responsive to voltage signals which are substantially higher than the normal logic level voltage. In this example, inverter 30 is responsive to voltage signals at levels of approximately 10 to 15 volts. When a voltage signal of this magnitude is applied to output terminal 32, output 38 of inverter 30 is pulled low. As explained in more detail below, this provides a path to ground for programming current flowing from a selected memory location in the matrix. Thus, a high voltage on a selected output terminal 32 can be used, in conjunction with row and column addressing inputs 12 and 18, to select the memory location which is to be programmed.

Figure 2:
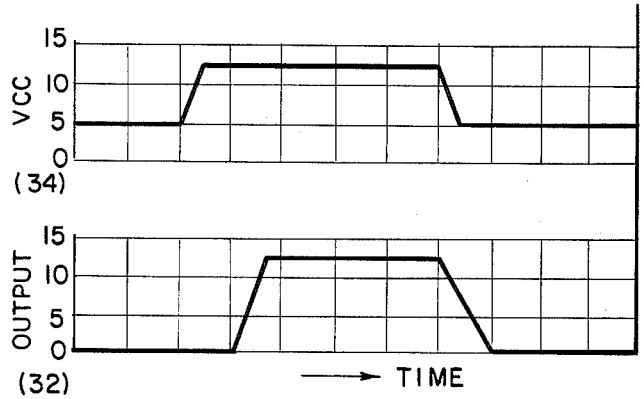
FIG. 2 shows a voltage/time diagram for the power supply and output terminals during a single programming cycle for the PROM architecture shown in FIG. 1.

A typical programming sequence is as follows: an address is applied to inputs 12 and 18; the voltage on power supply terminal 34 is raised in order to drive a relatively large programming current through a selected location; and a higher than normal (10 to 15 volts) voltage signal is applied to a selected output 32 to provide a path to ground, via inverter output 38, for the programming current supplied from terminal 34 to the selected location. A voltage/time diagram which illustrates the voltage levels present on power supply terminal 34 and the selected output terminal 32 during the programming sequence is shown in FIG. 2.

Figure 3:
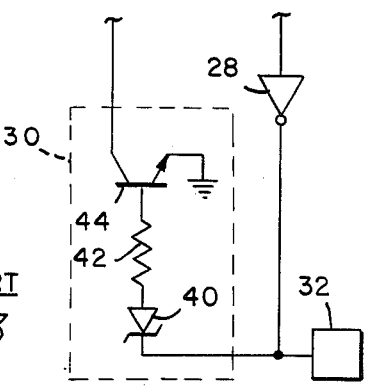
FIG. 3 shows, in detail, a representative segment of the output buffer of the PROM of FIG. 1.

FIG. 3 shows, in detail, representative segment 26 of output buffer 24. As shown there, inverter 30 includes zener diode 40, resistor 42, and transistor 44. Zener diode 40 has a breakdown voltage of approximately 9 volts so that, when a 10 to 15 volt signal is applied to output terminal 32, a voltage is applied to the base of transistor 44, via resistor 42. The emitter of transistor 44 is connected to a reference potential (i.e., ground). When transistor 44 is turned on by the voltage signal at its base, a path to ground is provided from the collector through the emitter. The collector of transistor 44 is connected, via decoder 20, to bit outputs 21 of matrix 10 and serves to sink programming current from the selected memory location.

In this arrangement, the output circuitry of inverters 28 must be capable of withstanding, without breakdown, the application of the higher voltage signals necessary to turn on transistor 44. Additionally, when power supply terminal 34 is raised to a higher voltage level to supply programming current, the operating current $I_{CC}$ increases dramatically. Thus, when a large memory is programmed by this technique, excessive amounts of power are consumed by and dissipated in the device.

FIG. 4 shows a PROM architecture which incorporates the improved programming circuitry of the present invention. Where possible and appropriate, like reference numerals are used to indicate like elements in FIGS. 1 and 4. The new or modified elements present in FIG. 4 include programming control input circuitry, indicated generally by reference numeral 46, bidirectional output buffer 48, and power supply terminal 49. Input circuitry 46 includes multi-purpose input terminal 50, input buffer 52, input terminal 54 and programming input buffer 56. A representative segment 58 of output buffer 48 includes output inverter 60 and a non-inverting programming input circuit 62. Inverter 60 differs from inverter 28 of FIG. 1 in that no breakdown protection is necessary at its output since the programming technique to be described does not require application of a high voltage to output terminal 32. Programming input circuit 62 provides a path to ground for programming current, via output 38, in response to the simultaneous application of a low (i.e., normal) voltage level signal at output 32 and a higher than normal voltage level signal at input terminal 50.

Due to the shortage of terminals available on devices of this type, input terminal 50 is preferably a multipurpose input terminal which operates as a control terminal (e.g., a chip enable) when a normal operating level voltage is applied. The circuitry associated with this control function is not shown in FIG. 4, but is represented generally by conductor 51 which is connected to terminal 50. Programming control input circuitry 46 is activated only when a substantially higher than normal operating level voltage, such as 10 to 15 volts, is applied to terminal 50. When such a higher voltage is present at terminal 50, a programming enable signal is produced at output 64 of buffer 52, causing buffer 56 and programming input circuit 62 to be enabled.

A typical programming sequence for the PROM of FIG. 4 is as follows: a selected memory location is addressed via input terminals 12 and 18; a higher than normal voltage is applied to input terminal 50; outputs 32 are allowed to tri-state (i.e., float); programming current input terminal 54 is raised to a voltage level high enough to ensure an adequate flow of programming current; and a selected output terminal 32 is pulled low to trigger the flow of programming current from a bit location through a corresponding output 38. A voltage/time diagram for power supply terminal 49 and selected buffer output 32 is shown in FIG. 5. As is apparent from FIG. 5, neither power supply power terminal 49 nor output terminal 32 is raised to a higher than normal operating voltage. Accordingly, high breakdown protection for the output of inverter 60 is not required and excessive power consumption or dissipation is not a factor since $V_{CC}$ is not raised to a high level.

FIG. 6 shows, in detail, a preferred embodiment of programming input circuit 62. This embodiment includes PNP transistor 66, resistor 68, diode 70 and NPN transistor 72. The base of transistor 66 is connected to output terminal 32. The collector of transistor 66 is connected to a reference potential (i.e., ground). The emitter of transistor 66 is connected, via resistor 68, to output 64 of buffer 52 and, via diode 70, to the base of transistor 72. The emitter of transistor 72 is connected to a reference potential, while the collector is connected to output 38. When a high voltage signal is produced at output 64 by the input circuitry and output terminal 32 floats, transistor 66 is turned on and node 74 is effectively connected to ground. Diode 70 ensures that the voltage drop across transistor 66 under these conditions is not sufficient to turn on transistor 72. When output 32 is pulled low, transistor 66 turns off and the voltage at node 74 rises. Transistor 72 is then turned on and the collector is effectively connected to ground. Transistor 72 thus provides a path to ground for programming current flowing from a selected memory location. Since transistor 66 is turned off during programming, output 32 of inverter 60 is isolated from programming currents and voltages and additional series protection elements are not required.

Referring again to FIG. 4, an alternative arrangement for supplying programming current to the matrix is illustrated by the circuit shown in broken lines and indicated generally by reference numeral 76. Circuit 76, which replaces programming current input terminal 54 and buffer 56, includes a connection from multi-purpose input terminal 50 to a buffer 80 which is, in turn, connected to matrix 10 as a source of programming current. In operation, programming current is supplied to matrix 10 from buffer 80 when input terminal 50 is raised to a second higher than normal voltage level (e.g., 20 to 30 volts). This allows multipurpose input terminal 50 to be used in place of programming current input terminal 54 and, thus, provides for more efficient pin usage. In this preferred embodiment, multi-purpose input terminal 50 is connected to an operating circuit (represented by conductor 51) which is responsive to a normal operational level voltage signal to control a matrix function, programming circuitry 46 which is responsive to a higher than normal operating voltage level signal to produce the programming enable signal, and programming current circuitry 76 which is responsive to a programming level voltage to supply programming current to the programming current input of the matrix.

Although this invention has been described in terms of specific examples and embodiments, it is to be clearly understood that this description is presented for purposes of illustration only and is not to be taken by way of limitation. Certain variations will be apparent to those skilled in the art. For example, the programming technique described can be used with other types of programmable devices, such as programmable logic arrays. Such variations are considered to be within the spirit and scope of this invention which is to be limited only by the terms of the appended claims.

What is claimed is:

1. A programmable matrix having bit addressing inputs, bit outputs, a power supply input, a programming current input, and programming control circuitry, said control circuitry comprising:

a multi-purpose input pin;

programming current circuit means, connected to the programming current input, for providing a flow of programming current to the matrix;

bidirectioeal output buffer means, connected to the bit outputs of the matrix and having at least one buffer output and having a control input for receiving a programming enable signal, for providing a current path for said programming current in response to application of a normal operating level voltage signal to said buffer output and substantially simultaneous application of a normal operating level voltage signal to the power supply input while said programming enable signal is present at the control input; and programming circuit means, connected to the multi-purpose input pin and to the control input of the bidirectional output buffer means, for producing said programming enaole signal in response to application of a first higher than normal operating level voltage signal to the multi-purpose input pin.

2. A programmable matrix according to claim 1, wherein said multi-purpose input pin is connected to operating circuit means for controlling an operating function of the matrix in response to application of a normal operating level voltage signal to the multi-purpose input pin.

3. A programmable matrix according to claim 1, wherein said control circuitry further comprises a programming current buffer means, having an input connected to the programming current circuit means, an output connected to said programming current input and a control input for receiving a programming enable signal, for controlling the flow of programming current to the matrix.

4. A programmable matrix according to claim 3, wherein said programming current buffer means input is connected to the multi-purpose input pin and, wherein said programming current circuit means is a higher than normal operating level voltage supply.

5. A programmable matrix according to claim 4, wherein said higher than normal operating level voltage supply is substantially higher in voltage than said first higher than normal operating level voltage signal.

6. A programmable matrix according to claim 1, wherein said control input of said bidirectional output buffer means is isolated from said buffer output by a first switching means.

7. A programmable matrix according to claim 6, wherein said first switching means is responsive to said normal operating level voltage signal applied to said buffer output and wherein said bidirectional output buffer means includes a second switching means for conducting a flow of programming current when said normal operating level voltage signal is applied to said buffer output and said programming enable signal is applied to said control input.

8. A programmable matrix according to claim 7, wherein said first switching means includes a first three terminal switch, having a first terminal connected to a reference potential, a second terminal connected to said control input, and a control terminal connected to said buffer output and, wherein said second switching means includes a second three terminal switch, having a first terminal connected to a reference potential, a second terminal connected to said bit outputs and a control terminal connected to said second terminal of said first switch.

9. A programmable matrix according to claim 1, wherein said bidirectional output buffer means includes a first transistor having a base connected to said buffer output, a collector connected to a reference potential, and an emitter connected by an impedance to said control input and by a diode to a base of a second transistor, said second transistor having an emitter connected to a reference potential and a collector connected to said bit outputs.

10. A programmable matrix having bit addressing inputs, bit outputs, a power supply input, a programming current input, and programming control circuitry, said control circuitry comprising:

programming current circuit means, connected to the programming current input, for providing a flow of programming current to the matrix;

circuit means for producing a programming enable signal;

bidirectional buffer means, connected between said bit outputs and at least one buffer output and having an input mode and an output mode and a control input for receiving said programming enable signal to enable said input mode, for providing a current path for said programming current in response to selective application of a normal operating level voltage signal to said buffer output, and application of a normal operating level voltage signal to said power supply input.

11. A programmable matrix according to claim 10, wherein said porgramming enable signal is a higher than normal operating level voltage signal.

12. A programmable matrix according to claim 11, wherein said control input pin of said bidirectional output buffer means is isolated from said buffer output by a first switching means.

13. A programmable matrix according to claim 12, wherein said first switching means is responsive to said normal operating level voltage signal applied to said buffer output and wherein said bidirectional output buffer means includes a second switching means for conducting a flow of programming current when said normal operating level voltage signal is applied to said buffer output and said programming enable signal is applied to said control input.

14. A programmable matrix according to claim 13, wherein said first switching means includes a first three terminal switch, having a first terminal connected to a reference potential, a second terminal connected to said control input, and a control terminal connected to said buffer output and, wherein said second switching means includes a second three terminal switch, having a first terminal connected to a reference potential, a second terminal connected to said bit outputs and a control terminal connected to said second terminal of said first switch.

15. A programmable matrix according to claim 10, wherein said bidirectional output buffer means includes a first transistor having a base connected to said buffer output, a collector connected to a reference potential, and an emitter connected by an impedance to said control input and by a diode to a base of a second transistor, said second transistor having an emitter connected to a reference potential and a collector connected to said bit outputs.

16. A method of programming a matrix having bit addressing inputs, bit outputs, a power supply unit, a programming current input, a bidirectional output buffer connected to said bit outputs and having a buffer output and a control input, comprising the steps of:
  a. applying addressing level voltage signals to said bit addressing inputs to select a bit to be programmed;
  b. applying a programming level voltage signal to the programming current input;
  c. applying a normal operating level voltage signal to the power supply input;
  d. applying a programming enable signal to the control input of the bidirectional buffer; and
  e. selectively applying a normal logic level voltage signal to the buffer output to cause the bidirectional buffer to provide a path for programming current to flow from the selected bit.

17. The method according to claim 16, wherein said programming enable signal is produced by applying a higher than normal logic level voltage signal to a multi-purpose input pin connected to the control input of the bi-directional buffer.

18. The method according to claim 17, wherein said programming level voltage signal is applied to said multi-purpose input pin and said multi-purpose input pin is connected to said programming current input.

* * * * *